United States Patent [19]

Berneur et al.

[11] Patent Number: 5,081,949

[45] Date of Patent: Jan. 21, 1992

[54] APPARATUS FOR SELECTIVE TINNING OF SUBSTRATE LEADS

[75] Inventors: Claude Berneur, Beaucouze; Jean-Pierre Boiteau, Villeveque, both of France

[73] Assignee: Bull, S.A., Paris, France

[21] Appl. No.: 639,273

[22] Filed: Jan. 10, 1991

Related U.S. Application Data

[62] Division of Ser. No. 325,939, Mar. 20, 1989, Pat. No. 4,985,749.

[30] Foreign Application Priority Data

Mar. 22, 1988 [FR] France ............................ 88 03674

[51] Int. Cl.⁵ ......................... B05C 3/02; B05C 11/06
[52] U.S. Cl. ........................................ 118/63; 118/74; 118/404; 118/407; 228/20; 228/37; 228/180.1
[58] Field of Search ................... 118/74, 404, 63, 74, 118/407; 228/20, 37, 180.1

[56] References Cited

U.S. PATENT DOCUMENTS

| | | | |
|---|---|---|---|
| 3,218,193 | 11/1965 | Isaacson | 118/74 |
| 4,132,856 | 1/1979 | Hutchinson | 357/70 |
| 4,396,457 | 8/1983 | Bakermans | 357/70 |
| 4,796,558 | 1/1989 | Chartrand et al. | 118/74 |
| 4,799,450 | 1/1989 | Cornellier | 118/74 |
| 4,822,989 | 4/1989 | Miyamoto et al. | 235/492 |

FOREIGN PATENT DOCUMENTS

| | | |
|---|---|---|
| 0133304 | 2/1985 | European Pat. Off. ............ 118/404 |
| 52-69564 | 6/1977 | Japan . |
| 54-113249 | 2/1978 | Japan . |
| 56-167357 | 12/1981 | Japan . |
| 57-79653 | 5/1982 | Japan . |
| 62-30342 | 2/1987 | Japan . |
| 62-20458 | 9/1987 | Japan . |
| 62-219950 | 9/1987 | Japan . |

Primary Examiner—Willard E. Hoag
Attorney, Agent, or Firm—Kerkam, Stowell, Kondracki & Clarke

[57] ABSTRACT

An apparatus for selectively tinning a zone of a plurality of leads overhanging a window of a substrate for a very large scale integrated circuit is provided, which employs a vise made up of a pair of hollow jaws forming a shaft when the jaws are in clamping position, wherein the shaft communicates with a supply of tin, a wave of tin being provided through the shaft to bathe the zone of the leads to be tinned, the apparatus further being adapted to send a jet of gas to the tinned zone of the leads.

10 Claims, 2 Drawing Sheets

APPARATUS FOR SELECTIVE TINNING OF SUBSTRATE LEADS

This is a continuation divisional of application Ser. No. 325,939, filed Mar. 20, 1989 now U.S. Pat. No. 4,985,749.

FIELD OF THE INVENTION

The invention relates to a substrate for a very large scale integrated circuit and to an apparatus for selective tinning of the leads of the substrate.

BACKGROUND OF THE INVENTION

Very large scale integrated circuits, also known as VLSI circuits or chips, at the present time are fine small plates of substantially square semiconductor material, more than 1 cm on a side, provided with a great number of input/output terminals, on the order of 300 to 400. In TAB technology (tape-automated bonding), each integrated circuit is mounted on a substrate comprising an insulating sheet in which a window is provided with leads arranged in an overhanging fashion in order to be connected, inside the window, to the input/output terminals of the integrated circuit. These terminals are therefore located on the periphery of the integrated circuit, either in a line or in staggered fashion. Ordinarily, the insulating sheet of the substrate forms a flexible tape provided with successive windows for mounting the integrated circuits and with perforations on the side for the displacement and positioning of the tape. Current terminology calls this tape a TAB tape, and the bundle of leads disposed overhangingly about each window is known as a spider. Manipulation of the substrate is done directly on the TAB tape or by way of a rigid frame. One rigid frame that is widely used is the type used to hold photographic slides, such as are described for instance in U.S. Pat. Nos. 4,007,479 and 4,069,496. In this frame, a portion of the TAB tape relating to one integrated circuit and its spider is positioned by means of the lateral perforations of the tape.

A TAB substrate for an integrated circuit has several applications. First, it serves to mount an integrated circuit on the free inner ends of the leads of the spider, by an operation known as ILB (inner lead bonding). It is then used to make tests of the integrated circuit, by applying test points to the contact zones formed by the outer ends of the leads of the spider on the substrate sheet. A distinction is made between simple tests for verifying the ILB soldering or checking the function of the integrated circuit, and elaborate tests such as to determine the reliability of the integrated circuit over time by way of accelerated aging (known as "burn-in"). Finally, one known application for a TAB substrate of an integrated circuit comprises cutting the leads of the spider in one window of the substrate, to enable picking up the integrated circuit, provided with its corresponding leads there, and fixing the ends of these leads to the respective zones of an interconnection substrate, such as a multilayer printed circuit board. This operation is known as OLB (outer lead bonding). At the present time, the spider, cut away from its substrate, is mounted in a package for its OLB connection to an interconnection substrate. On the printed wiring boards, the connection zones and the outer conductive portions are typically coated with a layer of tin-lead, and can then be easily soldered to a spider, if the spider is adapted to this type of soldering. The adaptation comprises simply uniformly tinning the entire outer surface of the leads of the spider. However, to adapt large scale integration spiders to tin-lead soldering presents problems, at present.

The first problem is to achieve uniform tinning of a spider intended for a very large scale integrated circuit, the leads of which are necessarily quite narrow and very close to one another. For example, for an integrated circuit having more than 300 input/output terminals, their spacing on the chip may be less than 100 $\mu$m, and the leads in the area of the OLB soldering zone may have a width of 100 $\mu$m, resulting in a spacing of equal value. Under these conditions, defects in coverage of the leads with the tin, such as filaments, spikes or blobs, either cause short circuits or tend to come into contact with the adjacent leads in the course of the ILB and OLB bonding, which easily interrupts the regularity in spacing of the leads. The solution presently used comprises covering the copper leads with gold, using bonding materials such as nickel, for example, as an intermediary.

The second problem in uniform tinning is encountered when the ILB connection of the spider is done on gold beads deposited on the input/output terminals of the chip. Eutectic gold-tin soldering can create intermetallic compounds that alter the mechanical and electrical properties of the soldering. This defect is even more undesirable, the smaller the surface area of the soldering. Gold-plating of the spider assures a reliable ILB connection by thermocompression on the gold beads of the integrated circuit.

The third problem in tinning a spider is in terms of the contact zones made at the outer ends of the spider and arises in the course of an elaborate functional test, such as that done after accelerated aging testing of the integrated circuit (burn-in). Aging of the integrated circuit translates into oxidation or alteration of the contact zones, if they are not gold-plated, and makes for wrong the measurements of the electrical test because of the possible wrong contacts of the test sensors with the zones.

Hence, the solution common to all these three problems is uniform gold-plating of the spiders. However, OLB soldering of a TAB spider on the normally tinned zones of a printed wiring board remains problematic because of the intermetallic compounds at the time of eutectic gold-tin soldering. Adapting a gold-plated spider to the OLB operation on a printed wiring board would thus comprise plating the zones of the board with the gold, which must be of a certain purity so as to be suitable for soldering by thermocompression. Selective gold-plating of the printed wiring boards would necessarily encounter technical difficulties that most often entail prohibitive cost.

In summary, a user wishing to avail himself of TAB substrates for very large scale chips, for wide distribution and at low cost, would have to choose between bare spiders, without tinning or without gold-plating, or completely gold-plated spiders.

OBJECT AND SUMMARY OF THE INVENTION

The present invention enables the OLB operation to be performed easily and at less expense by tin-based soldering of a dense spider with bare or gold-plated leads on the tinned zones of an interconnection substrate.

The invention comprises a substrate of a very large scale integrated circuit, including an insulating sheet in which a window is provided with leads disposed in overhanging fashion so as to be connected on the inside of the window to the terminals of the integrated circuit, characterized in that the leads have a tinned zone on the inside of the window.

An apparatus according to the invention for tinning a zone of leads disposed in overhanging fashion about a window of a substrate of a very large scale integrated circuit is characterized in that it comprises: a vise for clamping the leads, the hollow jaws of which, in the locking position, form a shaft or chimney defining the zone to be tinned at the level of the leads and communicating with a source of tin; a device for providing a wave of tin via the shaft or chimney in such a manner that it bathes said zone of leads for a predetermined period of time; and means for sending a jet of gas to the tinned zone.

The characteristics and advantages of the invention will become apparent from the ensuing detailed description, given by way of example, taken in conjunction with the accompanying drawings.

DESCRIPTION OF THE PREFERRED EMBODIMENT

Figure 1:
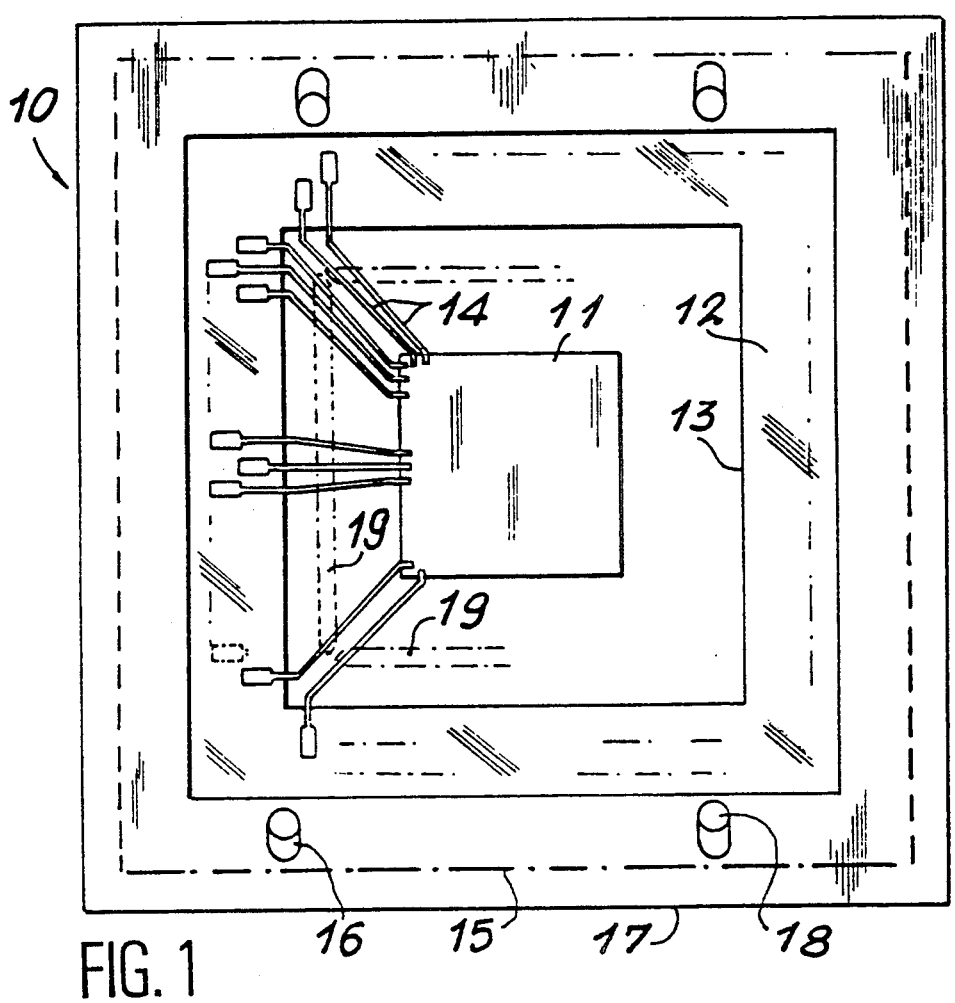
FIG. 1 is a plan view of a substrate for a very large scale integrated circuit according to the invention.

FIG. 1 shows a substrate 10 according to the invention of a very large scale integrated circuit 11, including an insulating sheet 12 in which a window 13 is provided with gold-plated leads 14 disposed in overhanging fashion on the sheet 12 about the window 13, so as to be connected inside the window to the terminals of the integrated circuit 11. The bundle of leads 14 forms the spider of the substrate 10 and is composed of four groups relating to the four sides of the integrated circuit 11. The leads 14 terminate on the sheet 12 in zones used for testing the function of the integrated circuit 11. In the example shown, the sheet 12 has been cut, along the dashed lines in FIG. 1, from a TAB tape 15, the edges of which are shown in dot-dash lines. The sheet 12 thus has the perforations 16 on the side of the tape 15. A rigid frame 17 fixes the sheet 12 in a position determined by pins 18 made to correspond with the perforations 16. In the substrate 10, the leads 14 of the spider are intended for being cut in the window 13 along the outer edge of a zone 19 provided for the OLB soldering. The zone 19 is present in the form of four narrow bands parallel to the four sides of the integrated circuit 11 and forming a substantially square border around it. In the substrate used in practice, the integrated circuit 11 was 12 mm on a side and had a spider with 300 leads 14, or in other words had 75 leads on a side. The zone 19 comprised a square border 24 mm on a side and 3.5 mm in width. At this level, the leads 14 succeed one another at a spacing of 317 $\mu$m, while being spaced apart from one another by 140 $\mu$m. The leads 14 have a uniform thickness of approximately 40 $\mu$m and their entire outer surface was covered with a layer of gold 1.3 $\mu$m thick.

Figure 3A:
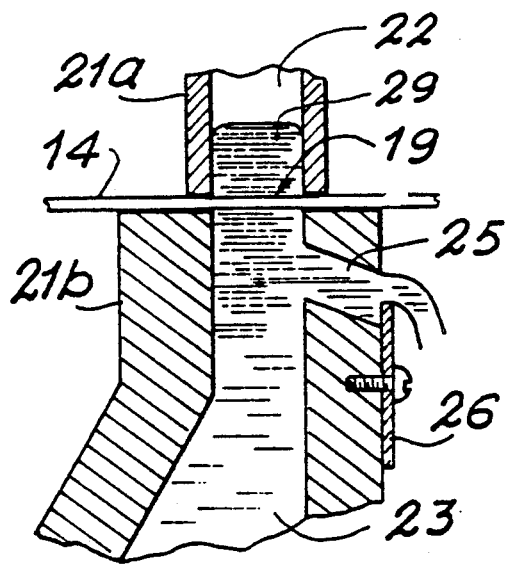
FIGS. 3A and 3B are detailed views of the apparatus shown in FIG. 2 in the position for tinning, illustrating the tinning phase and the phase of sending a jet of gas to the tinned zone of the substrate shown in FIG. 1, respectively.
Figure 3B:
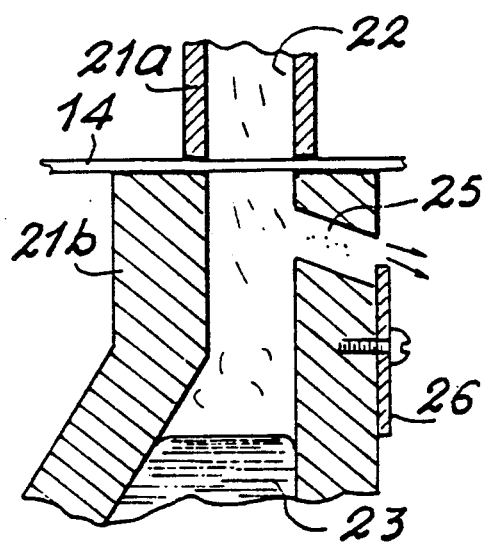

The substrate 10 according to the invention is distinguished by the fact that the zone 19 provided for the OLB operation is un-gold-plated by tinning. The tinning is performed for example by the apparatus schematically shown in FIG. 2 in an axial section, seen in an initial operating position. FIGS. 3A and 3B are sectional schematic views showing details of the apparatus 20 of FIG. 2 at the level of the zone 19 to be un-gold-plated on the substrate 10, and respectively illustrate two successive phases in the operation of gold-plating removal that follow the initial phase illustrated in FIG. 2.

Figure 2:
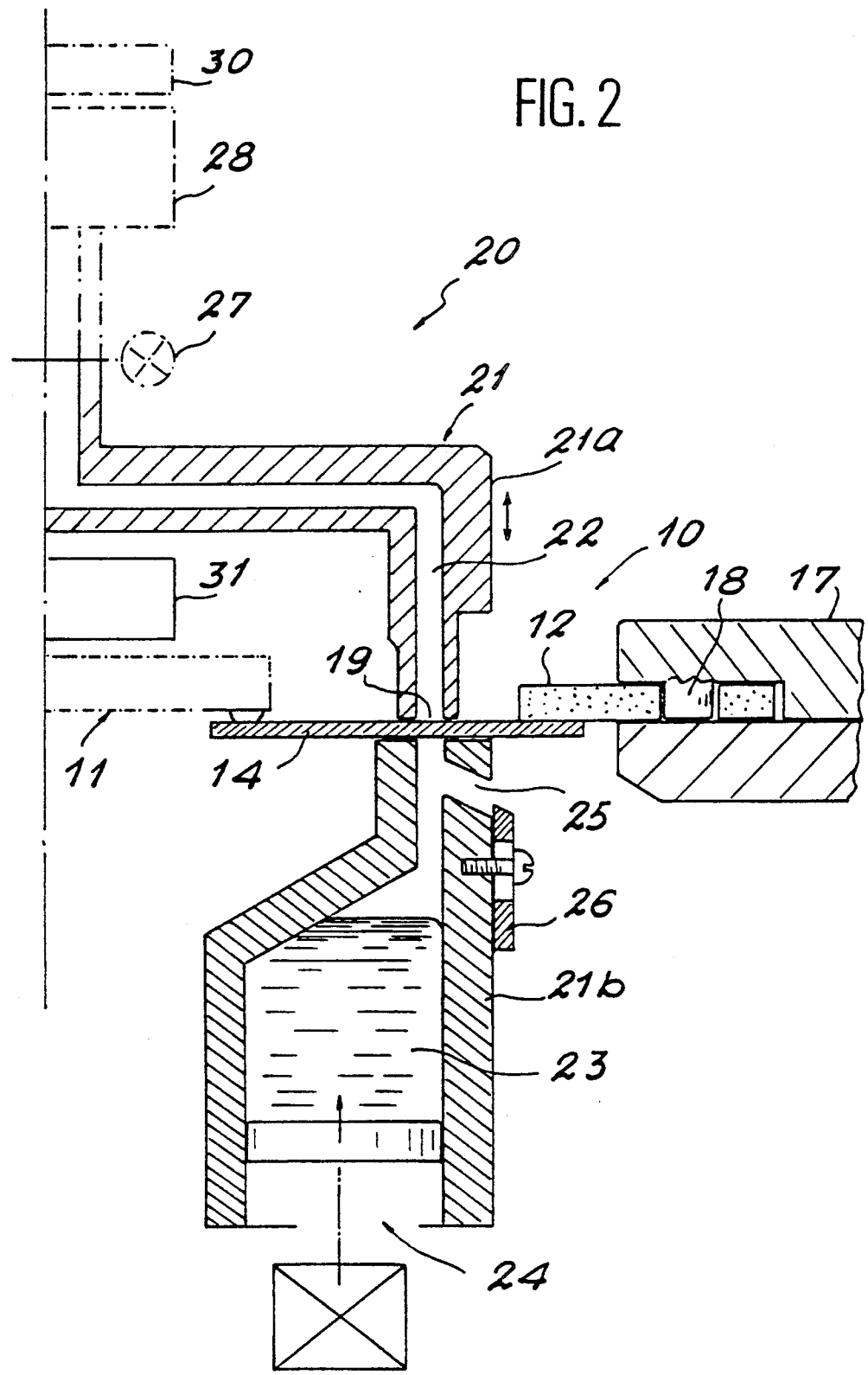
FIG. 2 is a fragmentary axial sectional view schematically showing an apparatus according to the invention for selective tinning for the removal of the gold plating of the leads of the substrate shown in FIG. 1.

The apparatus 20 shown in FIG. 2, used for removing the gold plating from the zone 19 of the leads 14 of the substrate 10, includes a vise 21, the two jaws 21a, 21b of which are configured to clamp the leads 14 at the level of the zone 19 from which the gold plating is to be removed. More precisely, the jaws 21a, 21b are hollow so that in the clamping position as shown they form a shaft 22, comprising four compartments, defining the zone 19 to be tinned at the level of the leads 14 and communicating with a source of tin 23. The source of liquid tin 23 forms a compressible pocket in the lower jaw 21b, the compression being performed by a compression device 24. In a standard manner, the tin is associated with a flux or pickling resin to assure the uniform deposition of the tin on the copper comprising the leads. The mixture ordinarily used for tinning will hereinafter be called simply tin. The level of the tin at rest in the pocket 23 is relatively remote from the upper end of the lower jaw 21b. The shaft 22, between the source of tin 23 and the upper portion of the lower jaw 21b, has a vent 25 to the outside, which is inclined downward. The vent 25 has an opening that is regulatable by a device 26, which simply comprises a blade traversed by oblong holes such that it can be fixed, vertically adjustably, by screws on the outer wall of each side of the lower jaw 21b. In the upper jaw 21a, the shaft is in communication with a source of compressed gas 28, via a fan 27.

The removal of the gold plating begins with the clamping position of the vise 21 shown in FIG. 2. In this position, the jaws 21a, 21b clamp the leads 14 in the window 13 of the substrate 10, and the cross section of the shaft 22 defines the zone 19 from which gold plating is to be removed, at the level of the leads 14. The fan 27 of the source of compressed gas 28 is closed, and the level of the tin at rest in the pocket 23 is below the vent 25. The operation of gold plating removal begins with the activation of the compression device 24, to supply a wave of tin 29, shown in FIG. 3A, via the shaft 22. FIG. 3A shows the wave of tin in its upper position, in which it bathes the zone 19 of the leads 14 for a predetermined period of time. Since the tin has the property of dissolving the gold, tinning by the wave 19 effects the removal of the gold plating. The duration of the tinning depends on various factors, in particular on the thickness of the gold to be removed. The height of the wave 29 in the shaft 22 and the duration of the tinning are regulated by the blade 26 of the vent 25 by way of which the tin flows. The compression device 24 is relaxed to cause the high level of the tin to return to below the vent 25, as shown in FIG. 3B. FIG. 3B illustrates the third phase in the removal of the gold plating according to the invention, in which the fan 27 has been opened in order to send the compressed gas from the source 28 to the zone 29 that has just been tinned. The gas leaves via the vent 25. The jet of gas is essentially intended to eliminate any trace of tin between the leads 14, to prevent short-circuiting among them. By heating the compressed gas to a temperature slightly greater than the melting temperature of the tin-lead, the elimination of excesses of tin between leads is facilitated, and the pickling flux mixed with the tin is activated, so as to leave a fine and homogenous layer of tin (4 μm in thickness, for example) on the copper, which facilitates the later OLB soldering. The gas from the source 28 is preferably a neutral gas, such as nitrogen, to prevent any oxidation.

The exemplary embodiment of the apparatus 20 that has just be described will suggest all manner of variant embodiments to one skilled in the art. For example, the source of compressed gas 28 might not be connected to the shaft 22. Then, it would suffice to unclamp the vise 21, until the tinning phase shown in FIG. 3A has been completed, and to supply the compressed gas to the leads 14 unclamped from the vise 21. In that case, the shaft 22 could be limited to the upper jaw 21a. On the other hand, it would be possible to omit the vent 25. The height of the wave 29 and the duration of tinning could in fact be regulated by any other means other than the vent 25, for example by a control device associated with the device 24 for controlling the compression of the pocket of tin 23.

Moreover, other accessories could be provided for the apparatus 20 shown. For example, a heating device 30 could be connected to the source of compressed gas 28, in order to send hot nitrogen to the tin for melting prior to the tinning phase shown in FIG. 3A. Advantageously, the temperature of the gas will be slightly greater than the melting temperature of the tin-lead, in order to activate the pickling flux that naturally covers the pocket of tin and thus to make the melting tin homogeneous when the wave 29 comes into contact with the leads 14 and bathes them. On the other hand, the apparatus 20 could include a cooling device 31 for the integrated circuit 11, in the case where the integrated circuit would be subjected to excessive heat during the removal of the gold plating. The cooling device could simply be a source of cold air aimed at the integrated circuit 11 during and optionally for some time after the period in which the substrate 10 is clamped in the vise 21.

More generally, the tinning zone 19 could be provided on any kind of substrate 10, the spider of which would for example comprise bare leads 14. Also, the tinning performed by the apparatus 20 could take place at any moment following the manufacture of the substrate and might be done by the user, or by the manufacturer at the request of the user. For the manufacturer, the apparatus 20 is efficient, inexpensive, fast, and flexible in use, so that custom-tinning adds little cost to that for producing a substrate.

Furthermore, although the invention shown is described for the sake of clarity and convenience in connection with a substrate provided with a single window, it will be understood that it is equally applicable to any improved TAB substrate, for instance in which the window includes a plurality of substantially square frames, as is the case with the substrate described in French Patent Application No. 86.04500 the priority application upon which U.S. Pat. No. 4,812,949, issued Mar. 14, 1989, is based, and intended for a very large scale integrated circuit package. These insulating frames can be attached to the insulating sheet 12 by leads aligned on the diagonals of the window 13 and formed like the frames beginning with the insulating sheet 12; these leads must be prevented from being in the presence of molten lead. To meet this condition, the zone 19 is composed of four bands, shown in FIG. 1, and separated in the corners of the window 14, and the shaft 22 of the apparatus 20 comprises four corresponding compartments. In practice, the apparatus 20 illustrated is thus adapted to this type of TAB substrate. However, it will be clear now that the shaft 22 and the zone 19 could form a continuous border around the integrated circuit 11, if the TAB substrate did not have such leads, such as in the substrate 10 shown in FIG. 1.

Finally, it should be noted that the edges of the jaws 21a, 21b shown, which clamp the leads 14, are flat and thus leave open spaces between adjacent leads. Considering the slight thickness of the leads of a large scale integration spider (on the order of 50 μm) and the surface tension of the melting tin, though, the tin could not normally expand outside the jaws through the spaces between the leads. However, it will be understood that the edges of the jaws could be configured or adapted in some other manner so as to prevent the escape of the tin.

What is claimed is:

1. An apparatus for tinning a zone of leads disposed in overhanging fashion about a window of a substrate of a very large scale integrated circuit, comprising vise means for clamping a plurality of leads, said vise means comprising a pair of hollow jaws, said hollow jaws forming a shaft when said jaws are disposed in a clamping position, said shaft defining a zone of said plurality of leads to be tinned, said shaft further being in communication with a source of tin; means for providing, from said source of tin, a wave of tin to said zone of said plurality of leads, wherein said zone is bathed in tin for a predetermined period of time; and means for sending a jet of gas to the tinned portion of the leads.

2. An apparatus as defined by claim 1, further comprising an element for heating the gas to be sent to a temperature slightly greater than a melting temperature of the tin.

3. An apparatus as defined by claim 1, including means for connecting a source of compressed gas to the shaft.

4. An apparatus as defined by claim 3, further comprising an element for heating the gas to be sent to a temperature slightly greater than a melting temperature of the tin.

5. An apparatus as defined by claim 3, wherein the shaft has a vent between the source of tin and the zone to be tinned.

6. An apparatus as defined by claim 5, wherein the vent has a regulatable opening.

7. An apparatus as defined by claim 1, wherein the shaft has a vent between the source of tin and the zone to be tinned.

8. An apparatus as defined by claim 7, further comprising an element for heating the gas to be sent to a temperature slightly greater than a melting temperature of the tin.

9. An apparatus as defined by claim 7, wherein the vent has a regulatable opening.

10. An apparatus as defined by claim 9, further comprising an element for heating the gas to be sent to a temperature slightly greater than a melting temperature of the tin.

* * * * *